United States Patent
Laitinen et al.

(10) Patent No.: US 7,888,986 B2
(45) Date of Patent: Feb. 15, 2011

(54) METHOD OF CONTROLLING A RECTIFYING BRIDGE IN A DIODE MODE AND A CIRCUIT FOR THE CONTROL

(75) Inventors: Matti Laitinen, Kirkkonummi (FI); Jussi Suortti, Helsinki (FI)

(73) Assignee: ABB Oy, Helsinki (FI)

( * ) Notice: Subject to any disclaimer, the term of this patent is extended or adjusted under 35 U.S.C. 154(b) by 75 days.

(21) Appl. No.: 12/495,933

(22) Filed: Jul. 1, 2009

(65) Prior Publication Data

US 2010/0039162 A1 Feb. 18, 2010

(30) Foreign Application Priority Data

Aug. 12, 2008 (EP) .................... 08162207

(51) Int. Cl.
*H03K 17/72* (2006.01)
(52) U.S. Cl. .................. 327/438; 327/441; 327/450; 327/467; 363/128; 363/135; 363/136
(58) Field of Classification Search ......... 327/438–442, 327/450, 467; 363/85, 96, 128, 135, 136
See application file for complete search history.

(56) References Cited

U.S. PATENT DOCUMENTS 5,796,599 A * 8/1998 Raonic et al. ............... 363/57
6,222,749 B1 * 4/2001 Peron ......................... 363/125
6,542,022 B2 * 4/2003 Gonthier et al. ............. 327/460

FOREIGN PATENT DOCUMENTS

| EP | 0 315 273 | 5/1989 |
| EP | 1 538 733 | 6/2005 |
| FR | 2 101 997 | 3/1972 |
| FR | 2 746 981 | 10/1997 |
| GB | 2 203 301 | 10/1988 |
| JP | 61-88789 | 7/1986 |

OTHER PUBLICATIONS

Patent Abstracts of Japan of JP 61-88789 dated Jul. 5, 1986.

* cited by examiner

*Primary Examiner*—Kenneth B. Wells
(74) *Attorney, Agent, or Firm*—Ladas & Parry LLP

(57) ABSTRACT

A method and a circuit for controlling a thyristor (V1) into conducting state, the thyristor (V1) being in a rectifier, which rectifier supplies DC voltage to a DC voltage circuit. The circuit comprising a trigger capacitor (C2) adapted to be charged from the voltage difference across the thyristor (V1) when the anode-to-cathode voltage of the thyristor is positive, a zener diode (V5) adapted to be triggered with the voltage of the trigger capacitor (C2), when the voltage of the trigger capacitor (C2) exceeds the breakdown voltage of the zener diode (V5), and an auxiliary thyristor (V3) adapted to be triggered with the current from the trigger capacitor (C2) flowing via the zener diode (V5), wherein the cathode of the auxiliary thyristor (V3) is connected to the gate of the thyristor (V1) for triggering the thyristor (V1) with the current from the trigger capacitor (C2) flowing via the auxiliary thyristor (V3) for using the thyristor (V1) in a diode mode.

6 Claims, 1 Drawing Sheet

US 7,888,986 B2

METHOD OF CONTROLLING A RECTIFYING BRIDGE IN A DIODE MODE AND A CIRCUIT FOR THE CONTROL

FIELD OF THE INVENTION

The present invention relates to a method of controlling a rectifying bridge in a diode mode and to a circuit for controlling the thyristors of the rectifying bridge in a diode mode, and particularly to a method and circuit which are used in a rectifying bridge for providing full DC voltage from the rectifier to a DC voltage circuit after the DC voltage circuit has been charged.

BACKGROUND OF THE INVENTION

Frequency converters typically have a DC voltage intermediate circuit which stores DC voltage for use for the inverter part. The inverter of a frequency converter is typically used for producing controlled alternating voltage to a load from the voltage of the intermediate circuit. The DC voltage to the intermediate circuit is rectified typically from AC mains voltage by using a rectifier bridge.

The DC voltage intermediate circuit or DC bus contains one or multiple capacitors for storing and smoothing the voltage. The capacitance of the intermediate circuit capacitors is large and when the frequency converter is taken into use, these capacitors have to be charged before any control operations can be carried out.

The capacitors of the intermediate voltage circuit are charged from the supplying mains voltage. The charging current has to be limited to a suitable level since otherwise the large current would harm the electrical components of the rectifier or cause erroneous operations of the protective components, such as fuses and like. The current limitation is typically carried out either by using a charging resistor or by controlling the controllable switches of the rectifier.

One type of rectifier commonly used also in frequency converters is a half-controlled rectifier bridge. The half-controlled bridge consists of multiple series connections of thyristors and diodes, and usually the thyristors are the upper components and thus their cathodes are connected to the positive rail of the DC intermediate circuit.

Once the intermediate circuit capacitor has been charged to a voltage that is near the value of the rectified mains voltage, the charging phase is over and the thyristors in the rectifier are usually operated as diodes. This means that the thyristors are controlled to a conducting state as soon as the anode to cathode voltage is positive, and the thyristor can be triggered to a conducting state. This operation of thyristors in diode mode, i.e. at full phase angle, ensures maximal voltage to the DC intermediate circuit.

In the prior known solutions the control of thyristors requires synchronization to the supplying network. The synchronization can be carried out with measurements of the voltages of the supplying network together with a phase lock circuit, which keeps the control of the thyristors in phase also in connection with dynamic changes in the network. The operation of the thyristors in the diode mode should be ensured also in special cases, such as during earth faults and blackouts.

One of the problems relating to known solutions thus relates to the need for synchronization of the rectifier bridge with the supply network for controlling the thyristors to the diode mode.

BRIEF DESCRIPTION OF THE INVENTION

An object of the present invention is to provide a method and a circuit for implementing the method so as to solve the above problem. The objects of the invention are achieved by a method and an arrangement which are characterized by what is stated in the independent claims. The preferred embodiments of the invention are disclosed in the dependent claims.

The invention is based on the idea of triggering thyristors of a half-controlled rectifier bridge directly from the anode-cathode voltage of the thyristors with the use of a feedforward circuit. The circuit of the invention uses a capacitor that is charged from the anode-cathode voltage of the thyristor such that the charge from the capacitor triggers the thyristor reliably.

An advantage of the method and circuit of the invention is the simplicity obtained for ensuring the triggering of the thyristors in the diode mode. The circuit of the invention requires only few components, none of which are magnetic components, thus the circuit can be easily scaled to multiple power levels.

Further advantage of the present invention is that the method does not require synchronization with the supply network. The method and the circuit of the invention are tolerant to dynamic changes of the network, and the thyristor is triggered whenever the anode-cathode voltage of the thyristor is positive. Further, the circuit of the present invention is inexpensive, since it does not require auxiliary voltages referred to the cathode potential and does not contain magnetic components or integrated circuits.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
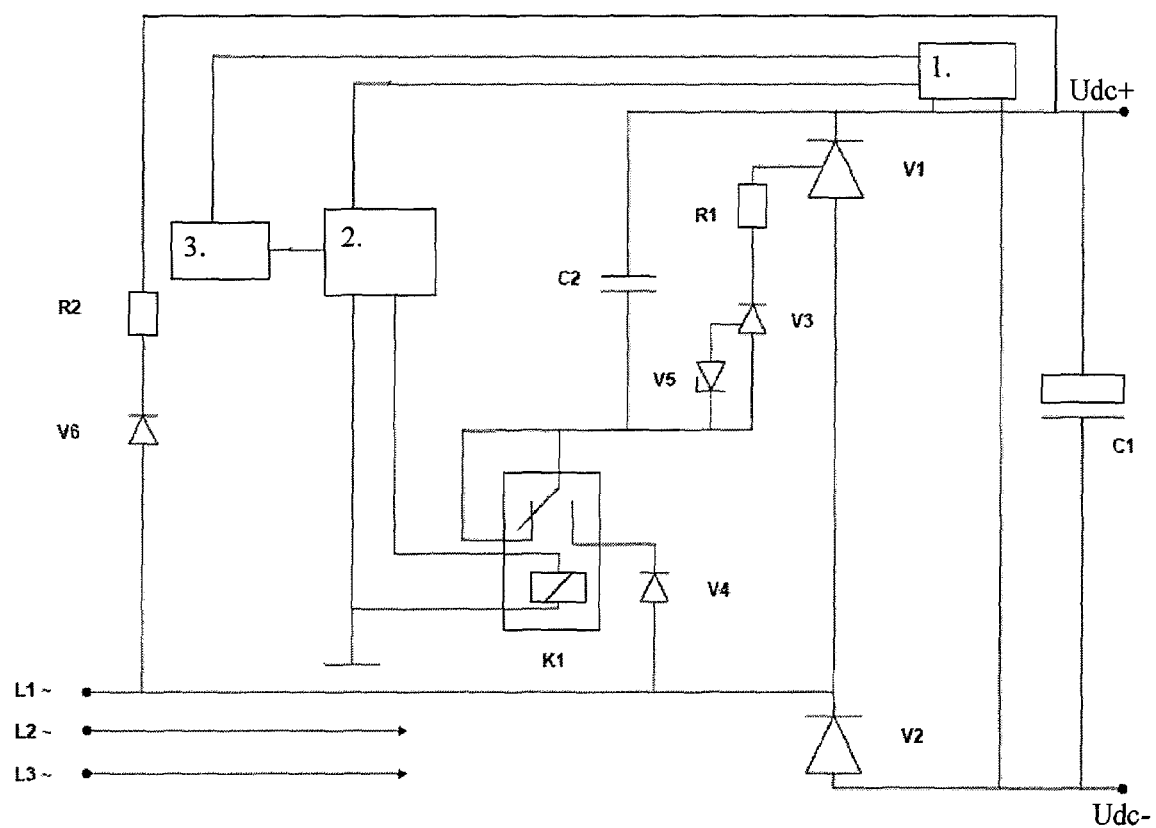
FIG. 1 illustrates the circuit of the invention in connection with the charging circuitry of the DC intermediate voltage circuit.

FIG. 1 shows the circuit according to the present invention in connection with circuitry used to charge the DC circuit capacitor C1. The capacitor C1 is connected between positive and negative rails of the DC circuit. In a frequency converter the inverter part is connected to the DC circuit for providing alternating current to the load, and in connection with the frequency converters the DC circuit is usually referred to as intermediate voltage circuit of the DC bus. However, the inverter part is not shown in FIG. 1. Further, FIG. 1 shows only one leg of the rectifier that supplies DC voltage to the intermediate circuit, the other legs being omitted for simplicity. The rectifier leg consisting of thyristor V1 and diode V2 shown in FIG. 1 is connected to a supplying phase L1. The other phases L2, L3 of the three-phase alternating voltage supply should be similarly connected to the legs of the rectifier omitted in the FIG. 1.

In the example shown in FIG. 1 the charging of the intermediate voltage circuit is carried out by using a charging resistor R2. A charging current flows via resistor R2 and diode V6 to the capacitor C1 during the charging period when the voltage of line L1 exceeds the voltage of the capacitor C1. The charging current returns to the alternating voltage source via diodes of the rectifier not shown in the FIG. 1. Once the voltage of the intermediate voltage circuit has risen to a predetermined level, the charging period is ended. The predetermined voltage level is a voltage level after which the operation of thyristors in diode mode can be started without a risk of failures in the rectifier due to the current still charging the capacitor C1.

The charging phase operation can also be carried out by controlling the phase angles of the thyristors. The thyristors are controlled for limiting the charging current, and the charging phase is ended similarly when the voltage of the intermediate voltage circuit has reached a predetermined limit.

FIG. 1 shows means 1 for measuring the voltage of the intermediate voltage circuit. These means are connected across the intermediate circuit and provide the voltage measurement for a charging control circuit 2. The charging control circuit holds the predetermined voltage limit and determines from the measured voltage when to end the charging phase and change to diode mode operation.

FIG. 1 further shows a power supply 3 that is formed from the voltage of the intermediate voltage source. The operating voltage for the power supply is shown here to originate from the means 1 for measuring the voltage. These measuring means 1 are directly connected to the DC voltage and convey a voltage to the power supply 3 that can be used as operating voltage for the power supply 3. For simplicity, both the voltage information to the charging control circuit 2 and voltage to the power supply 3 from the measurement means 1 are shown in FIG. 1 as signal lines.

The power supply 3 feeds power to the charging control circuit 2. After the charging control circuit 2 has determined the voltage level of the intermediate circuit to be at the predetermined level, it changes the operation of the half-controlled rectifier to diode mode. This change is carried out in the embodiment of FIG. 1 with a relay K1 in which the contact is shown in the charging mode. The change to the diode mode operation is carried out by switching the contact of the relay K1 to the cathode of diode V4. This change uses the circuit of the invention. It should be noted that while the power supply 3 is shown in FIG. 1 as supplying only the charging control circuit, the power supply is also used in other supplying purposes regardless of the present invention. Thus the present invention uses a power supply that is present in the circuitry. Also the connection of the power supply 3 to the means 1 for measuring the voltage is shown only for simplicity and the power supply can receive its input power from other sources.

The circuit of the invention comprises a trigger capacitor C2, zener diode V5 and an auxiliary thyristor V3. When the cathode of the diode V4 is in an electrical contact with the triggering circuit, the capacitor C2 is charged from the voltage difference between supply line L1 and positive rail Udc+ of the voltage intermediate circuit. More specifically, the capacitor C2 is charged when the voltage of the supply line L1 exceeds the voltage of the intermediate voltage circuit. Diode V4 is used to block the current to the capacitor C2 when the supply line voltage is lower than the intermediate circuit voltage.

At the same time as the capacitor C2 charges, the thyristor V1 of the rectifier is forward-biased, i.e. the anode-to-cathode voltage is positive, and the thyristor can be triggered. In fact, the capacitor C2 and the thyristor V1 are connected in parallel when the diode V4 conducts.

In the circuit of the invention the zener diode V5 is connected such that the cathode of the zener V5 is coupled to one end of the capacitor C2. The anode of the zener is further connected to the gate of the auxiliary thyristor V3 and the anode of the auxiliary thyristor is connected to the cathode of the zener V5. The cathode of the auxiliary thyristor is connected to the gate of the thyristor V1 via a gate resistor R1. The circuit consisting of the zener diode V5, the auxiliary thyristor V3, resistor R1 and thyristor V1 is connected in parallel with the trigger capacitor C2.

When the voltage in the trigger capacitor C2 rises, the same voltage is seen also in the parallel circuit. The voltage builds up in this parallel circuit in the zener diode through the cathode and gate of thyristor V1, gate resistor R1 and the cathode and gate of the auxiliary thyristor V3. Nearly all the voltage of the trigger capacitor is seen over the zener diode, since the cathode to gate voltage of the thyristors is negligible when the thyristors are in blocking state.

The voltage of the trigger capacitor rises because the line voltage of supply line L1 is higher than the positive rail voltage Udc+, and once the voltage in the trigger capacitor has risen above the breakdown voltage of the zener diode V5, the capacitor C2 starts to discharge through the zener diode V5. This current from the capacitor flows further to the gate of the auxiliary thyristor V3 and triggers the thyristor V3.

The auxiliary thyristor V3 moves into conducting state and the voltage build-up from the trigger capacitor C2 discharges further through the thyristor V3 via the gate resistor R1 to the gate of the thyristor V1. The gate of the thyristor receives a strong current originating from the trigger capacitor and the thyristor V1 is turned into conducting state.

As explained above, when the diode mode operation is enabled (in FIG. 1 by switch K1), the trigger capacitor C2 is charged from the voltage difference between the line voltage and the positive rail of the DC intermediate circuit. The same voltage also forward-biases the thyristor V1 of the rectifier. The operation of the circuit is fast, and almost instantly after the thyristor V1 is forward-biased, it is turned on and the diode mode operation is achieved with the current from the trigger capacitor C2. The zener diode V5 in the circuit of the invention allows the voltage in the capacitor C2 to rise to such a level that the charge in the capacitor C2 is able to reliably turn on the controlled thyristor V1.

In the event that for some reason the thyristor is not turned on with the above described current pulse, the trigger circuit of the invention produces another current pulse to the gate of the thyristor in the same manner. Once the thyristor is successfully turned on, the small anode-to-cathode voltage of the thyristor V1 does not allow for the voltage to build up in the capacitor C2 and thus only one successful current pulse is provided to the gate of the thyristor for each time the line voltage is higher than the intermediate circuit voltage.

In the above, the functioning of the diode mode operation is described only with respect to one phase. In FIG. 1, however, the supply voltage is a three-phase voltage. It is clear that for the rectifier to be operated in a diode mode, all the legs of the rectifier relating to different input phases have to be turned into diode mode. Thus the operation described above is carried out for each leg of the rectifier separately, such that each thyristor is operated with its respective anode to cathode voltage. The means 1 for measuring the voltage of the intermediate voltage circuit, charging control circuit 2 and the power supply 3 are common for all trigger circuits used for different thyristors.

It is clear for a skilled person that the method and circuit of the invention can also be used in connection with supplying voltages having an arbitrary number of phases. The present invention can also be used in connection with, for example, 12 pulse bridges. The operation in the diode mode is achieved without synchronization to the supplying network. The circuit of the invention is thus capable of providing diode-mode operation of half-controlled rectifier bridge also in problematic circumstances, where the synchronization causes problems.

In the above the invention is described in connection with a frequency converter. In a frequency converter an inverter part is connected to the intermediate voltage circuit. It is however clear that the DC voltage generated to the DC voltage circuit, such as the intermediate voltage circuit, can be used by any other device that is suitable for using DC voltage as input voltage.

In the above, the invention is described in a rectifier where the controllable thyristor is connected to the positive potential of the rectified DC voltage and the diode is in the negative potential side. It is, however clear for a skilled person that the controllable thyristor V1 may take the place of the diode V2 in FIG. 1 and, correspondingly, the diode V2 may take the place of the thyristor V1 in FIG. 1. The present invention operates without modifications regardless whether the thyristor is in the upper or lower leg.

It will be obvious to a person skilled in the art that, as the technology advances, the inventive concept can be implemented in various ways. The invention and its embodiments are not limited to the examples described above but may vary within the scope of the claims.

The invention claimed is:

1. A circuit for controlling a thyristor (V1) into conducting state, the thyristor (V1) being in a rectifier, which rectifier is adapted to supply a DC voltage to a DC voltage circuit, characterized in that the circuit comprises
   a trigger capacitor (C2) adapted to be charged from the voltage difference across the thyristor (V1), when the anode-to-cathode voltage of the thyristor is positive,
   a zener diode (V5) adapted to be triggered with the voltage of the trigger capacitor (C2), when the voltage of the trigger capacitor (C2) exceeds the breakdown voltage of the zener diode (V5), and
   an auxiliary thyristor (V3) adapted to be triggered with the current from the trigger capacitor (C2) flowing via the zener diode (V5), wherein
   the cathode of the auxiliary thyristor (V3) is connected to the gate of the thyristor (V1) for triggering the thyristor (V1) with the current from the trigger capacitor (C2) flowing via the auxiliary thyristor (V3) for using the thyristor (V1) in a diode mode.

2. A circuit according to claim 1, characterized in that the circuit further comprises
   means (1) for measuring the voltage of the DC voltage circuit and means for enabling the charging of the trigger capacitor (C2) in response to the means for measuring the voltage.

3. A circuit according to claim 2, characterized in that the means for enabling the charging of the DC voltage circuit include a controllable switch (K1), which is adapted to couple the trigger capacitor (C2) between a supplying phase voltage and positive rail (Udc+) of the DC voltage circuit via a diode (V4), which is connected such that it enables the trigger capacitor (C2) to be charged when the supplying phase voltage is higher than the voltage of the positive rail (Udc+) of the DC voltage circuit.

4. A frequency converter comprising a circuit according to claim 1.

5. A method of controlling a thyristor (V1) into conducting state, the thyristor (V1) being in a rectifier, which rectifier supplies DC voltage to a DC voltage circuit, characterized in that the method comprises the following steps after the DC voltage has risen to a predetermined level:
   charging a trigger capacitor (C2) from the voltage difference across the thyristor (V1) when the anode-to-cathode voltage of the thyristor is positive,
   triggering a zener diode (V5) with the voltage of the trigger capacitor (C2) when the voltage of the trigger capacitor (C2) exceeds the breakdown voltage of the zener diode (V5),
   triggering an auxiliary thyristor (V3) with the current from the trigger capacitor flowing via the zener diode (V5), and
   triggering the thyristor (V1) with the current from the trigger capacitor (C2) flowing via the auxiliary thyristor (V3) for using the thyristor (V1) in a diode mode.

6. A method according to claim 5, wherein the DC voltage circuit is the intermediate circuit of a frequency converter and the method is carried out in said frequency converter.

* * * * *